United States Patent

Naylor

[15] 3,691,470

[45] Sept. 12, 1972

[54] CHOPPER AMPLIFIER

[72] Inventor: Joseph Edward Naylor, Mayfield Heights, Ohio

[73] Assignee: Keithley Instruments, Inc., Solon, Ohio

[22] Filed: March 10, 1971

[21] Appl. No.: 122,908

[52] U.S. Cl. ....................328/58, 307/240, 330/9, 330/10, 307/251

[51] Int. Cl. ....................H03k 5/04

[58] Field of Search ..........307/240; 328/57, 58, 134; 330/9, 10; 332/43 B, 44

[56] References Cited

UNITED STATES PATENTS

| | | | |
|---|---|---|---|
| 3,399,358 | 8/1968 | Rinehart | 330/9 X |
| 3,424,981 | 1/1969 | Erdman | 330/10 X |
| 2,974,288 | 3/1961 | Norgaard | 330/10 |
| 3,014,135 | 12/1961 | Hewlett et al. | 330/10 X |
| 3,354,401 | 11/1967 | Lode | 330/10 |
| 3,541,320 | 11/1970 | Beall | 330/9 X |

*Primary Examiner*—Donald D. Forrer
*Assistant Examiner*—R. C. Woodbridge
*Attorney*—Yount & Tarolli

[57] ABSTRACT

A chopper amplifier is disclosed which is particularly applicable for use in conjunction with amplifying low level signals to higher level signals suitable for use with electrical measuring circuitry. The amplifier includes a modulator circuit for receiving a low level signal from an unknown source and providing therefrom an amplitude modulated AC signal at the modulating frequency and of an amplitude proportional to that of the low level signal. The modulated signal is then amplified by an AC amplifier and demodulated at the modulating frequency to obtain a DC output signal. The modulator circuit includes first and second switches, such as solid state switches, which serve when actuated to respectively apply either the low level signal or a reference level signal to the AC amplifier. A driver circuit is employed for purposes of alternately actuating the switches at the modulating frequency, and in such a manner that the switches are both deactuated during each switching cycle for a common off period during which neither the low level signal nor the reference level signal is applied to the AC amplifier. In this manner the chopper amplifier presents a high input impedance to the source to thereby minimize loading of the unknown source.

13 Claims, 5 Drawing Figures

INVENTOR
JOSEPH EDWARD NAYLOR
BY Yount and Tarolli
ATTORNEYS

INVENTOR
JOSEPH EDWARD NAYLOR
BY Yount and Tarolli
ATTORNEYS

CHOPPER AMPLIFIER

This invention relates to the art of signal amplifiers and, more particularly, to an improved isolation amplifier which serves to amplify low level signals with minimum noise.

The invention is particularly applicable for use in conjunction with electrical measuring circuitry to provide readout indications of amperes, volts or resistance and will be described with particular reference thereto; although it should be appreciated that the invention has broader applications and may be used in various applications where an isolation amplifier is desired for amplifying low level signals with minimum noise.

Typically, electrical measuring circuits are provided with sufficient flexibility to be used for various ranges of operation, such as to provide full scale readings for either 1 millivolt or 1,000 volts. To achieve this flexibility the input signal is normalized, that is, it may equal 1 volt for either a full scale reading of 1 millivolt or 1,000 volts. Thus, low level signals such as nanovolts must be substantially amplified prior to being applied to the measuring circuitry. The unknown source, however, may carry either 50 or 60 cycles per second line frequency noise which, of course, should be eliminated during amplification. Such periodic noise may be eliminated with tuned filters and the filtered signal may be amplified with a DC amplifier. However, such circuitry may generate other nonperiodic noise and the DC amplifier may drift.

Chopper amplifiers have been used as isolation amplifiers between an unknown source and electrical measuring circuitry for amplifying low level signals while eliminating periodic noise such as 50 or 60 cycles per second line frequency. Conventionally, a chopper amplifier employs a modulating circuit for converting an unknown low level signal into an amplitude modulated AC signal at the modulating frequency and of a magnitude proportional to that of the low level signal. The modulated signal is then amplified with an AC amplifier and demodulated with a synchronous demodulator to obtain a DC output signal proportional to the low level signal. Chopper amplifiers typically exhibit greater time stability than that of DC amplifiers. However, chopper amplifiers known heretofore exhibit substantially lower input impedance than DC amplifiers resulting in undue loading of an unknown source, particularly those which exhibit high impedances. This will degrade the accuracy of electrical measurements made with the measuring circuitry. In addition, such chopper amplifiers typically exhibit higher offset currents than DC amplifiers, causing additional degradation in the accuracy of measurements particularly where the unknown source exhibits a high impedance.

The primary object of the present invention is to provide an improved isolation amplifier exhibiting high input impedance and low offset current.

A still further object of the present invention is to provide an improved chopper amplifier particularly applicable for use in conjunction with electrical measurement circuitry wherein only minimum loading of an unknown source is obtained.

A still further object of the present invention is to provide an improved isolation amplifier particularly applicable for use in conjunction with electrical measurements while minimizing the offset current of the amplifier.

A still further object of the present invention is to provide an improved chopper amplifier for use in conjunction with electrical measuring circuitry of the type including analog to digital converters so that sufficient isolation is presented between the source and the converter to minimize the affects of switching transients.

The present invention contemplates the provision of a chopper amplifier for amplifying low level signals wherein the amplifier includes a modulating circuit that serves to receive a low level signal and to provide therefrom an amplitude modulated AC signal at the modulating frequency and of an amplitude proportional to that of the low level signal. The modulated signal is then amplified, as with a suitable AC amplifier, and demodulated with a synchronous demodulator operating at the modulating frequency to provide a DC output signal having a value proportional to that of the low level signal.

In accordance with the present invention the modulator circuit employs a pair of switches, such as solid state high impedance switches, which respectively serve, when actuated, to apply the low level signal and a reference level signal to the AC amplifier. A driver circuit is employed for purposes of alternately actuating the two switches at the modulating frequency and in such a manner that the two switches are both deactuated during each switching cycle for a common off period during which neither the low level signal nor the reference signal is applied to the AC amplifier. In this manner assurance is had that a common on time will not occur and, hence, a high impedance is presented to the unknown source to prevent undue loading thereof.

In accordance with a more limited aspect of the present invention circuitry is provided for adjusting the time duration of the common off period.

In accordance with a still further aspect of the present invention it is contemplated that the switches each exhibit the characteristic of being actuated only in response to the application thereto of a drive signal exceeding a given level, and that first and second trains of oppositely phased, substantially square wave signals be generated for use in alternately actuating the two switches, and that circuitry be provided for retarding at least one of the edges of each of the square waves so that during each cycle of operation a period exists wherein the magnitude of each actuating signal is less than that necessary to actuate the switches into conduction and, hence, a common off period exists.

The foregoing and other objects and advantages of the invention will become more readily apparent from the following description of the preferred embodiment of the invention taken in conjunction with the accompanying drawings which are a part hereof and wherein.

Figures 1, 4:
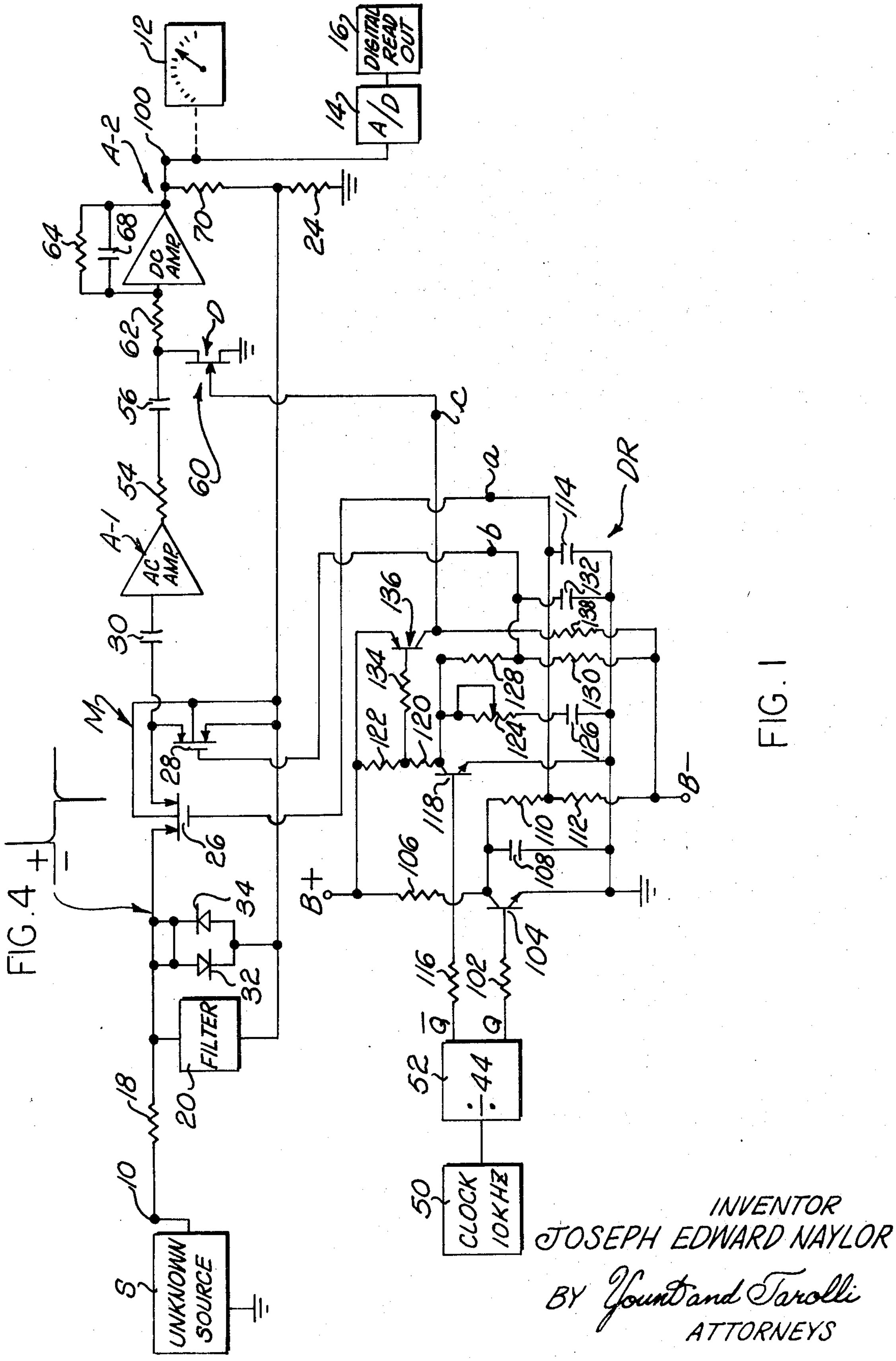
FIG. 1 is a combined schematic-block diagram illustration of the preferred embodiment of the invention.

Referring now to the drawings wherein the showings are for purposes of illustrating the preferred embodiment of the invention only and not for purposes of limiting same, FIG. 1 illustrates the preferred embodiment of the chopper amplifier which serves to amplify a low level signal, such as that obtained from an unknown source S connected to input terminal 10, to a high level signal, provided at output terminal 100 for use by electrical measuring circuitry, such as an analog meter 12, but preferably by an analog to digital converter 14 having a digital readout 16. Whereas the analog to digital converter 14 may take various forms it is preferred that the converter take the form illustrated and described in co-pending United States patent application Ser. No. 050,213, entitled Drift Compensated Circuit, filed on June 26, 1970 in the names of Pieter G. Cath and Morris S. Klapfish, assigned to the same assignee as the present invention. The chopper amplifier includes a modulating circuit M driven by a driver circuit DR to modulate the low level signal at the modulating frequency to obtain an amplitude modulated AC signal exhibiting an amplitude proportional to that of the low level signal from source S. The amplitude modulated AC signal is then amplified with a conventional AC amplifier A–1 and demodulated by a synchronous demodulator D, also operated by the driver circuit DR, with the demodulated signal being applied to a DC amplifier A–2 to provide at output terminal 100, a higher level DC signal proportional to that of the unknown source and with minimum noise. Having briefly described the operation of the amplifier attention is now directed to the following detailed description.

It is contemplated that the unknown source S may be a resistance or voltage or current. Although not shown in FIG. 1, it is conventional when measuring current to develop a voltage proportional to the unknown current across a fixed resistor so that the input to terminal 10 is a voltage level signal. Similarly, although not shown in FIG. 1, it is conventional when measuring resistance to utilize a constant current source to develop a voltage across the resistor proportional to its resistance and apply the voltage level signal to terminal 10. In this manner, the circuitry serves as a multimeter. For purposes of simplifying the description herein, it will be assumed that the unknown source S is a voltage signal.

The voltage level signal of the unknown source S is applied between ground and input terminal 10. This signal is applied through a suitable resistor 18 and thence through a low pass filter 20 and a resistor 24 to ground. Filter 20 serves to reject high frequency signals and pass low frequency signals, such as those below 10 cycles per second. The filtered signal is then applied to the modulating circuit M which includes a pair of solid state switches that exhibit high impedance and which preferably take the form of insulated gate MOS–FET transistors 26 and 28. As shown in FIG. 1, the drain-source electrodes of transistor 26 are connected in series circuit with resistor 18 and an AC coupling capacitor 30 to the input of the AC amplifier A–1. On the other hand, the drain-source electrodes of transistor 28 are connected across filter 20 and, thence, through resistor 24 to ground. A pair of oppositely poled, parallelly connected diodes 32 and 34 are connected across filter 20 and serve as overload protection for the field effect transistors. The modulator circuit is driven by the driver circuit DR which, as will be described in greater detail hereinafter, has a pair of output terminals *a* and *b* respectively connected to the gates of transistors 26 and 28. Output terminals *a* and *b* carry modified square wave signals which are out of phase by 180° and exhibit a frequency which will not beat with line frequency at either 50 cycles per second or 60 cycles per second. Thus, a clock source 50 provides a train of clock pulses at a frequency of 10,000 cycles per second and these pulses are applied to a divider circuit 52 which divides the frequency by a factor of 44 to obtain square wave signals at output terminals Q and $\overline{Q}$ which are 180° out of phase with respect to each other and exhibit a frequency of 227.27 cycles per second.

The amplified signal, as taken from the AC amplifier A–1, is applied through a resistor 54 and a coupling capacitor 56 to the demodulator circuit D. The demodulator circuit D includes a type J field effect transistor 60, known as a J–FET, connected between capacitor 56 and ground. The gate electrode of transistor 60 is connected to output terminal *c* of driver circuit DR so that demodulator circuit is synchronized with modulator circuit M. The demodulated signal is then applied through a resistor 62 to the DC amplifier A–2. The DC amplifier is provided with a feedback resistor 64 having a capacitor 68 connected in parallel therewith so as to provide a degree of filtering for smoothing out ripples. Output resistor 70 is connected in series with resistor 24 to ground so as to provide a load for the output voltage between ground and terminal 100 for application to the electrical measuring circuitry. A feedback path is provided from the junction between resistor 24 and resistor 70 to the modulator circuit M and is connected to the source electrode of transistor 28. The feedback path serves to increase the impedance of the field effect transistors employed in the modulating circuit to provide greater stability of operation and serves to prevent drifting of the DC amplifier.

Figure 2A:
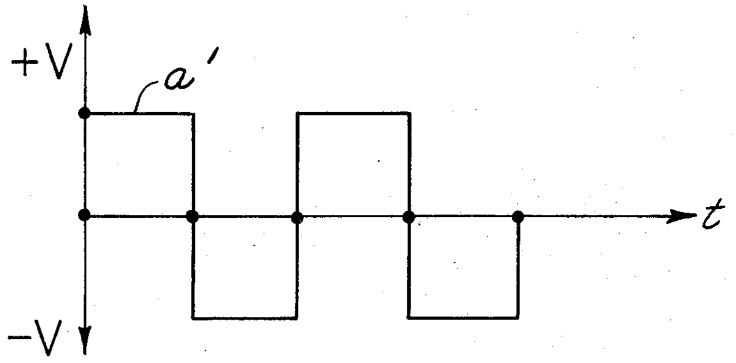
FIGS. 2A and 2B illustrate waveforms of voltage with respect to time of two square wave signals.
Figure 2B:
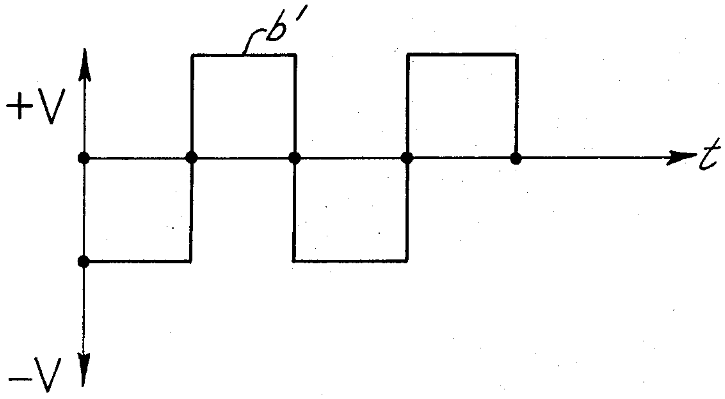

Reference is now made to the waveform illustrations in FIGS. 2A and 2B. These two waveforms respectively represent square wave signals *a'* and *b'* which are 180° out of phase and at the modulating frequency of 227.27 cycles per second. These would be the waveforms at terminals *a* and *b* if the driver circuit DR was not present. The waveform of signal *a'* would be applied to the gate electrode of transistor 26 and the waveform of signal *b'* would be applied to the gate electrode of transistor 28 so that these transistors are alternately actuated into conduction on the negative half cycles of these two signals. However, if the switching times of the two transistors 26 and 28 are not accurate then both switches may be conductive at the same time for a short period during each switching cycle. Such switching inaccuracies may result, for example, from stray capacitance existing between the gate to source electrodes, or the gate to drain electrodes of the transistors, or between the gate electrodes and ground. Dependent on these factors such a common on time may occur during the switching periods and hence a small portion of the source will be shunted to ground to thereby lower the input impedance of the modulator circuit. This will degrade the accuracy of the output signals particularly for high impedance sources. In addition, during the switching between transistors 26 and 28 these stray capacitance effects will cause switching transients or spikes of opposite polarity, as shown for example by the waveform of FIG. 4, on the input side of modulator M. To the extent these switching transients, or spikes, are not of equal magnitudes then an offset current will be present on the input side of the modulator to further degrade the accuracy of the output signal.

Figure 3:
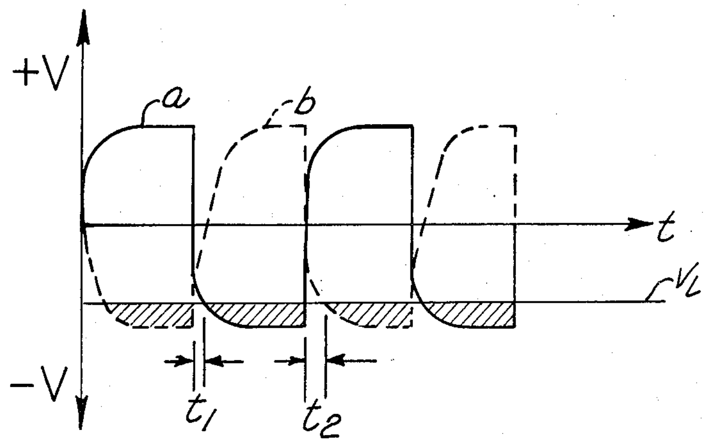
FIG. 3 is a graphical illustration of voltage with respect to time of the composite of two square wave signals which have been modified so that both their rise and fall times are delayed in accordance with the present invention; and, FIG. 4 is a graphical illustration of voltage with respect to time illustrating transient voltage spikes which may occur during switching of the modulator circuit.

In accordance with the present invention the two trains of square waves taken from terminals Q and $\overline{Q}$ are modified by the driver circuit DR so that the waveforms existing at output terminals a and b are shaped, such as those shown in FIG. 3. Thus, waveforms *a* and *b* are shaped so that at least the fall times of the lagging edges are delayed somewhat as opposed to being abrupt square wave signals. Consequently, during each cycle of operation a greater period of time is required for the negative half cycle of each signal to attain a magnitude, in a negative sense, which is greater than the firing potential $V_L$ of transistors 26 and 28. During each cycle of operation of the modulator circuit M a common off time will exist as shown by time periods $T_1$ and $T_2$ in FIG. 3. It will be noted that off time $T_2$ is slightly greater than that of off time $T_1$ since, as will be explained in greater detail hereinafter, the relative rise times may be varied so that, for example, waveform *b* exhibits a slower rise time than that for waveform *a*. Having briefly described the purpose of driver circuit DR, attention is now directed to the following detailed description of the circuitry employed and its manner of operation.

The driver circuit DR is connected to the output terminals Q and $\overline{Q}$ of divider circuit 52. This divider circuit may take various forms, such as a plurality of flip-flop circuits, having two output terminals Q and $\overline{Q}$ to provide two trains of square wave signals which are 180° out of phase. The signal taken from output terminal Q is applied through a resistor 102 to the base of an NPN transistor 104 having its emitter connected to ground and its collector connected through a resistor 106 to a B+ voltage supply source. A signal delay capacitor 108 is connected between the collector and emitter electrodes of transistor 104. Resistors 110 and 112 are connected together in series between the collector of transistor 104 and a B− voltage supply source. The junction between resistors 110 and 112 serves as output terminal *a* of the driver circuit DR. An additional delay capacitor 114 is connected between this junction and ground. Consequently, whenever transistor 104 is biased into conduction by a positive pulse from output terminal Q of divider circuit 52, capacitor 108 discharges through the collector to emitter electrodes of the transistor. Once the transistor becomes reverse biased the capacitor commences to charge toward the level of the B+ voltage source through resistor 106. This charging cycle accounts for the delay in the leading edge of waveform *a* shown in FIG. 3. An additional delay of both the leading and lagging edges of waveform a is provided by capacitor 114.

The output signal at terminal $\overline{Q}$ is applied through resistor 116 to the base of an NPN transistor 118 having its emitter connected to ground and its collector connected through resistors 120 and 122 to the B+ voltage supply source. The collector of this transistor is also connected through the resistance portion of a potentiometer 124 and a time delay capacitor 126 to ground. A pair of series connected resistors 128 and 130 are connected between the collector of transistor 118 and the B− voltage supply source. The junction of these two resistors serves as the output terminal *b*. A second time delay capacitor 132 is connected from this junction to ground.

As in the case with transistor 104, each time transistor 118 is biased into conduction, capacitor 126 discharges through the collector to emitter electrodes of the transistor. Once the transistor is reverse biased, the capacitor is charged through resistors 122, 120 and the resistance portion of potentiometer 124. The values of the capacitors 108 and 126 are preferably chosen so that the rise time of waveform *b* is substantially longer than that for waveform *a*. Capacitor 132 provides additional delay for both the leading and lagging edges of waveform *b*.

The junction of resistors 120, 122 is connected through a resistor 134 to the base of a PNP transistor 136 having its emitter connected to the B+ voltage supply source and its collector connected through a resistor 138 to the B− voltage supply source. The collector of transistor 136 serves as the output terminal *c* connected to the gate electrode of field effect transistor 60. Transistor 136 is alternately turned on and off in accordance with the modulating frequency and whenever the transistor is in its on condition output terminal *c* is sufficiently positive in magnitude to bias the field effect transistor 60 into conduction for synchronously demodulating the AC signal obtained from amplifier A–1.

Since the fall time of the lagging edges of waveforms *a* and *b* are delayed in time a common off time $T_1$ or $T_2$ occurs during each cycle of operation. This assures that the input circuit of modulating circuit M will present a high impedance to source S. The leading edge of waveform *b* may be adjusted by varying the amount of the resistance presented by potentiometer 124 during the charging cycle of capacitor 126. This will vary the common off time and the relative levels of the spikes (see FIG. 4) on the input side of the modulating circuit M. As the spikes are adjusted to be of substantially equal magnitude but of opposite polarity the offset current existing at the input side of the modulating circuit is minimized or eliminated.

The description herein has been with respect to transistors 26 and 28 wherein a negative threshold level $V_L$ is required for turn-on. If other transistors be used requiring a positive threshold, then at least the leading edges must be delayed to obtain a common off time. The lagging edges would then be adjusted to vary the off time.

The invention has been described with reference to a specific preferred embodiment, but is not limited to same as various modifications may be made without departing from the spirit and scope of the invention as defined by the appended claims.

I claim:

1. A chopper amplifier for amplifying low level signals and comprising:

modulating means for receiving a low level signal and providing therefrom an amplitude modulated AC signal of a given frequency and of an amplitude proportional to that of said low level signal;

AC amplifying means for amplifying said AC signal;

demodulator means for demodulating said amplified AC signal at said given frequency to provide a DC output signal;

said modulating means including first and second electronic switching means for, when actuated, respectively applying a said low level signal and a reference level signal to said AC amplifying means; and, drive means for alternately actuating said first and second switching means at said given frequency and in such a manner that said first and second switching means are both fully deactuated during each switching cycle for a common off period during which neither said low level signal nor said reference signal is applied to said AC amplifying means so as to thereby present a high input impedance during said common off period to said low level signal.

2. A chopper amplifier as set forth in claim 1, including means for adjusting the time duration of said common off period.

3. A chopper amplifier as set forth in claim 1, wherein said demodulator means includes third switching means controlled by said drive means so as to be operated in synchronism with said modulating means.

4. A chopper amplifier as set forth in claim 3, including DC amplifier means for amplifying said DC output signal.

5. A chopper amplifier as set forth in claim 4 in combination with:

analog to digital converter means for providing a digital representation of said DC output signal; and, readout means for providing a readout in dependence upon said digital representation.

6. A chopper amplifier for amplifying low level signals and comprising:

modulating means for receiving a low level signal and providing therefrom an amplitude modulated AC signal of a given frequency and of an amplitude proportional to that of said low level signal;

AC amplifying means for amplifying said AC signal;

demodulator means for demodulating said amplified AC signal at said given frequency to provide a DC output signal;

said modulating means including first and second switching means for, when actuated, respectively applying a said low level signal and a reference level signal to said AC amplifying means; and, drive means for alternately actuating said first and second switching means at said given frequency and in such a manner that said first and second switching means are both deactuated during each switching cycle for a common off period during which neither said low level signal nor said reference signal is applied to said AC amplifying means;

said first and second switching means exhibiting the characteristic of being actuated only in response to application thereto of a drive signal exceeding a given level, and means for providing first and second trains of oppositely phased substantially square wave signals having magnitudes which vary between first and second levels at said given frequency, with one of said first and second levels exceeding said given level;

means for retarding at least a specific one of the leading or lagging edges of each of said square waves so that during each cycle of said square waves a said off period exists when the magnitudes of both said wave signals are less than said given level and, hence, both said switching means are not actuated.

7. A chopper amplifier as set forth in claim 6, wherein said retarding means includes means for delaying the rise time of one of said square wave signals by a greater amount than that of the other.

8. A chopper amplifier as set forth in claim 6, wherein said retarding means includes means for delaying both the rise and fall time of the leading and lagging edges of both of said square wave signals.

9. A chopper amplifier as set forth in claim 6, including means for varying the time duration of said off period.

10. A chopper amplifier as set forth in claim 9, wherein said off period varying means includes circuit means for varying the rise and fall times of one of said square waves so as to vary said off period.

11. A chopper amplifier as set forth in claim 6, wherein said retarding means includes first and second time delay circuit means for respectively retarding the rise and fall times of the leading and lagging edges of said first and second square wave signals.

12. A chopper amplifier as set forth in claim 11, wherein said second time delay circuit means includes circuit means for retarding the said rise time of said second square wave signal at a slower rate than that of said first square wave signal.

13. A chopper amplifier as set forth in claim 12 wherein said second time delay circuit means includes means for adjusting at least said rise time for said second square wave signal.

* * * * *